United States Patent [19]
Shamlou et al.

[11] Patent Number: 6,024,393
[45] Date of Patent: Feb. 15, 2000

[54] ROBOT BLADE FOR HANDLING OF SEMICONDUCTOR SUBSTRATE

[75] Inventors: Behzad Shamlou, San Jose; Wen Chiang Tu, Mountain View; Xuyen Pham, Fremont; Yu Chang, San Jose; Daniel O. Clark, Pleasanton; Shun Wu, Cupertino, all of Calif.

[73] Assignee: Applied Materials, Inc., Santa Clara, Calif.

[21] Appl. No.: 08/740,886

[22] Filed: Nov. 4, 1996

[51] Int. Cl.⁷ .............................. B25J 15/06; B65G 49/07
[52] U.S. Cl. ..................... 294/64.1; 294/1.1; 294/907; 414/941; 901/46
[58] Field of Search ............................ 294/1.1, 32, 64.1, 294/64.3, 902, 907; 901/40, 46; 414/935–941, 222, 225

[56] References Cited

U.S. PATENT DOCUMENTS

| | | | |
|---|---|---|---|
| 4,002,254 | 1/1977 | Olofsen | 414/941 |
| 4,518,349 | 5/1985 | Tressler et al. | 414/941 |
| 4,545,327 | 10/1985 | Campbell et al. | 118/728 |
| 4,620,738 | 11/1986 | Schwartz et al. | 294/64.1 |
| 4,705,951 | 11/1987 | Layman et al. | 250/442.1 |
| 4,720,130 | 1/1988 | Andou | 414/941 |
| 4,819,167 | 4/1989 | Cheng et al. | 364/167.01 |
| 4,836,733 | 6/1989 | Hertel et al. | 414/225 |
| 4,911,597 | 3/1990 | Maydan et al. | 414/217 |
| 4,951,601 | 8/1990 | Maydan et al. | 118/719 |
| 5,224,809 | 7/1993 | Maydan et al. | 414/217 |
| 5,227,001 | 7/1993 | Tamaki et al. | 156/345 |
| 5,280,979 | 1/1994 | Poli et al. | 294/64.1 |
| 5,280,983 | 1/1994 | Maydan et al. | 294/119.1 |
| 5,324,155 | 6/1994 | Goodwin et al. | 294/64.3 |
| 5,387,067 | 2/1995 | Grunes | 414/217 |
| 5,445,486 | 8/1995 | Kitayama et al. | 414/937 |
| 5,483,138 | 1/1996 | Shmooklet et al. | 318/568.16 |
| 5,534,073 | 7/1996 | Kinoshita et al. | 118/728 |
| 5,556,147 | 9/1996 | Somekh et al. | 294/64.1 |
| 5,669,644 | 9/1997 | Kaihotsu et al. | 414/941 |

FOREIGN PATENT DOCUMENTS 1-209739  8/1989  Japan .................................. 294/64.1

*Primary Examiner*—Dean Kramer
*Attorney, Agent, or Firm*—Shirley Church

[57] ABSTRACT

The amount of particulate contamination produced due to rubbing between a semiconductor substrate and the robotic substrate handling blade has been greatly reduced by the use of specialized materials either as the principal material of construction for the semiconductor substrate handling blade, or as a coating upon the surface of the wafer handling blade. In particular, the specialized material must exhibit the desired stiffness at temperatures in excess of about 450° C.; the specialized material must also have an abrasion resistant surface which does not produce particulates when rubbed against the semiconductor substrate. The abrasion resistant surface needs to be very smooth, having a surface finish of less than 1.0 micro inch, and preferably less than 0.2 micro inch. In addition, the surface must be essentially void-free. In the most preferred embodiments, the upper, top surface of the substrate handling blade is constructed from a dielectric material being smooth, non-porous, and wear-resistant. A preferred material for construction of the substrate handling blade is single crystal sapphire. Other single crystal materials, such as single crystal silicon and single crystal silicon carbide should also perform well. In a particularly preferred embodiment of the substrate handling blade, a capacitance sensor is used to indicate the presence of a semiconductor substrate on the surface of the handling blade and a structure through which vacuum is applied may be used to hold (chuck) the semiconductor substrate to the surface of the handling blade.

8 Claims, 6 Drawing Sheets

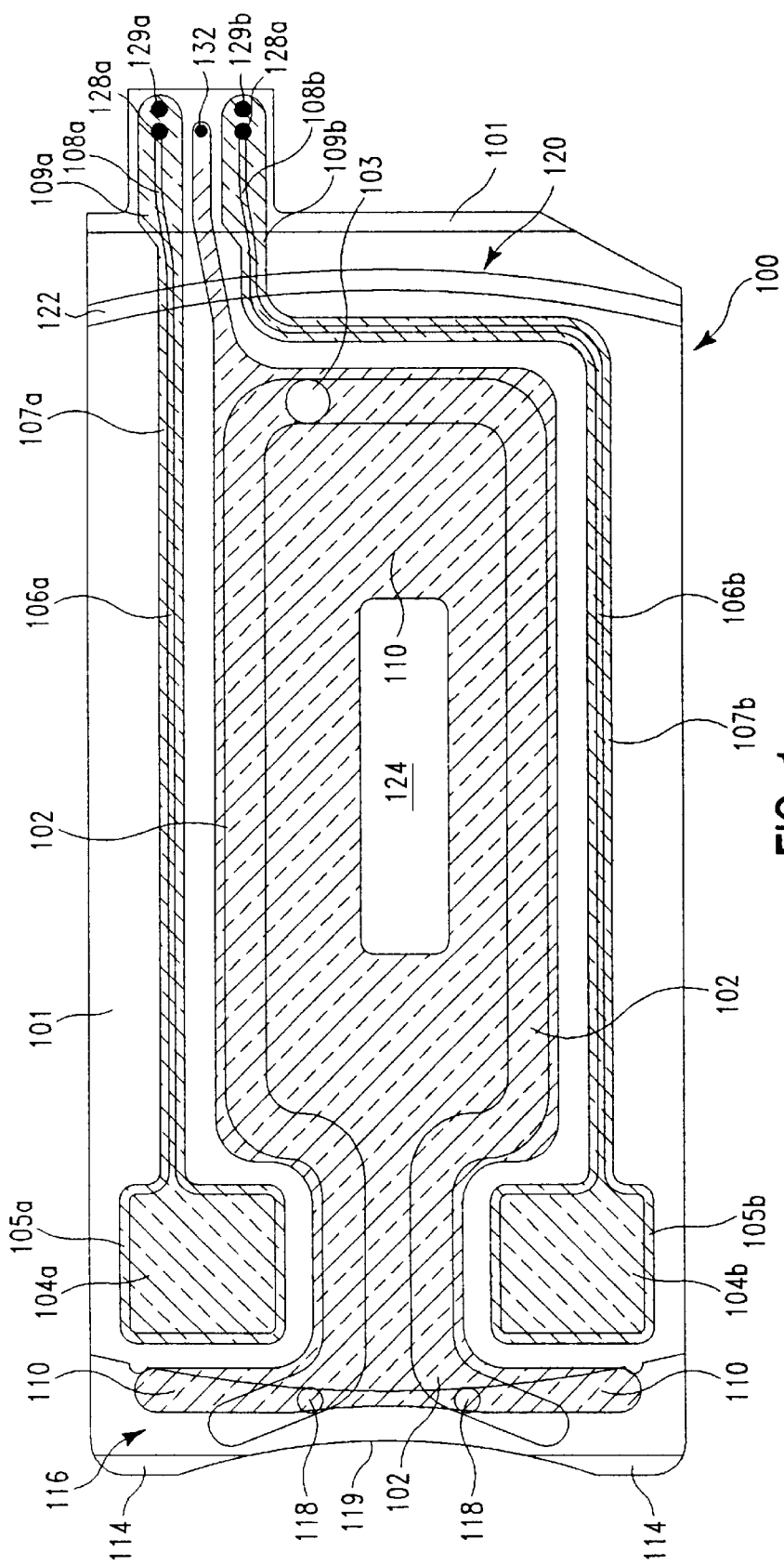
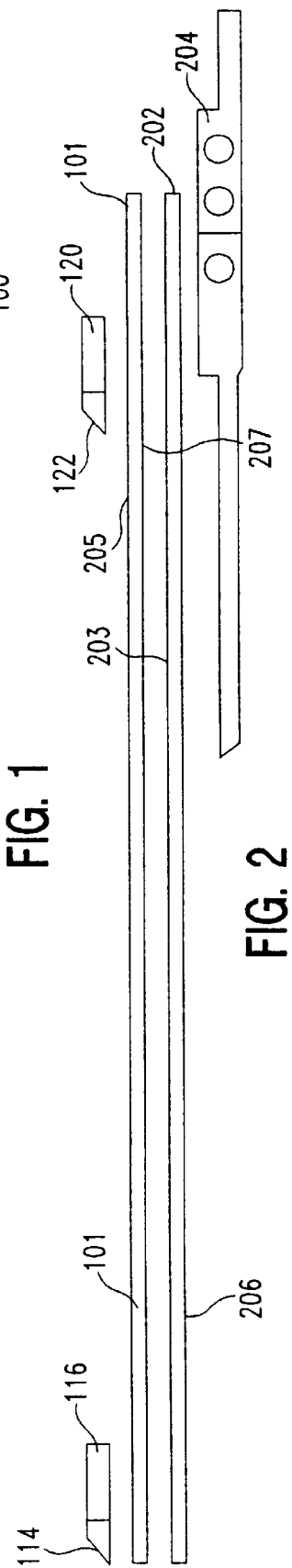
FIG. 1
FIG. 2

ROBOT BLADE FOR HANDLING OF SEMICONDUCTOR SUBSTRATE

BACKGROUND OF THE INVENTION

1. Field of the Invention

The present invention pertains to a semiconductor substrate handling blade which is used for handling substrates, typically thin wafers, during processing operations. Generally, the robot-operated substrate handling blade obtains the substrate from one location and transfers it to another within the processing system.

2. Brief Description of the Background Art

Semiconductor processing has been automated in recent years, to provide both efficiency in processing steps and to avoid contamination of the semiconductor substrate which might otherwise occur. As a part of this automation, semiconductor substrates, typically thin wafers, are frequently stored in cassettes to await further processing. In the most commonly used cassette designs, the wafers are horizontally oriented within the cassette with minimal spacing between each wafer. To place the wafers within the cassette and remove them without damage to or contamination of the wafers requires the use of specially designed robot-operated wafer handling equipment.

U.S. Pat. No. 4,620,738 to Schwartz et al., issued Nov. 4, 1986 describes a vacuum pick suitable for removing semiconductor wafers from and replacing wafers in a cassette holder. The vacuum pick includes a thin profile housing having a wafer support surface with a cavity therein, a resilient, flexible member covering a portion of the cavity to form an enclosure, and a rigid chuck mounted on the flexible member to permit movement of the chuck relative to the housing. Vacuum is applied to the enclosure so the wafer and the chuck are retracted against the housing and held firmly in place.

U.S. Pat. No. 4,705,951 to Layman et al., issued Nov. 10, 1987, discloses a wafer processing system including wafer handling arms incorporated into vacuum isolation valves. A loadlock with elevator and optical sensor is used to inventory and position a cassette of wafers. The wafers in the cassette can be randomly accessed.

U.S. Pat. No. 4,911,597 to Maydan et al., issued Mar. 27, 1990, describes a wafer processing system which includes an autoloader mounted within a load lock for providing batch, cassette-to-cassette automatic wafer transfer between the semiconductor processing chamber and cassette load and unload positions within the load lock. The system provides rapid, contamination-free loading and unloading of semiconductor wafers. Of particular interest herein, the processing system includes a shuttle blade and robotic wafer transfer system or robot. An indexer, the shuttle blade, and the robot work cooperatively to unload the wafers from containers such as cassettes onto wafer support hexodes and to offload the wafers from the hexode and return the wafers to the cassettes. The shuttle blade is a two-pronged blade which is mounted for generally horizontal pivotal movement to position the blade ends relative to particular loading and unloading stations. One blade is positioned to remove a wafer from the cassette while the other blade is positioned to off-load a processed wafer into the receiving cassette.

U.S. Pat. No. 5,387,067 to Howard Grunes, issued Feb. 7, 1995 describes a semiconductor cassette and transfer system for facilitating the direct and unloading of wafers from different sides of a cassette. Disclosed as a part of the transfer system is a robot blade which is fitted with a series of stepped edges which reduce the amount of wafer movement possible during loading/unloading operations, even if the wafer is misaligned with respect to the blade.

U.S. Pat. No. 5,483,138 to Shmooklet et al., issued Jan. 9, 1996, describes a system and method for automated positioning of a substrate in a process chamber. In particular, equipment is disclosed including a robot that can transfer a semiconductor substrate, such as a silicon wafer, from a cassette through a central transfer chamber and into one or more processing chambers about and connected to the transfer chamber in which the robot is located. An array of optical sensors is used to define the exact location of a semiconductor substrate relative to the processing chamber.

U.S. Pat. No. 5,556,147 to Somekh et. al., issued Sep. 17, 1996, discloses a wafer tray and a ceramic wafer carrying blade for semiconductor processing apparatus. The description of the apparatus itself and the process environments in which the apparatus is used serve as excellent background leading up to the present advance in the art. Somekh et. al. describes a ceramic wafer carrying blade with vacuum pick integral to the blade for transferring a wafer between storage cassette and transfer chamber. A removable wafer support tray is used in combination with the wafer carrying blade to move a wafer between a storage elevator and a processing chamber in an evacuated process environment.

Several of the above-described systems address the need for a wafer handling blade which reduces the amount of particulate contamination which can occur during handling of the wafers (due to rubbing between the surface of the wafer handling blade and the wafer); the need for an accurate means of determining the location of the wafer upon the handling blade; and the need for a means of compensating for misalignment which may occur between the blade and a wafer to be transported by the blade.

The majority of semiconductor substrate handling blades described above, and those commercially available and used within the industry are constructed from metal, and typically have a stainless steel main body. More recently developed handling blades have front and rear shoulders for holding the substrate in place (known as front and rear shoes). The front shoe is typically constructed from aluminum and the rear shoe from anodized aluminum. The Somekh et. al. reference is to an alumina ceramic handling blade, to provide structural strength under the high-heat operating conditions of the wafer processing reactors, even though the handling blade has an especially thin cross-sectional thickness.

The semiconductor handling blades have loading and unloading functions which produce particulate contamination from both the substrate surface and from the handling blade surface. The rubbing action which creates the particulates occurs when the substrate travels across the front shoe during uploading, when a vacuum chuck is used to pull the substrate surface against the surface of the handling blade, when the substrate travels across the surface of the back shoe as it settles into the space between the front and rear shoes, and when the substrate is off loaded from the handling blade.

One of the preferred wafer handling blade designs provides for wafer uploading or pick up in a manner so the front shoe of the handling blade sits in the center of the wafer, where the wafer is held in place by pulling a vacuum at an opening on the surface of the front shoe. The wearing between a silicon wafer surface and the front surfaces of the handling blade described above in this operation produces as many as 3,000 to 7,000 particles. This number might be even higher if the front shoe were anodized aluminum which would tend to gouge the wafer surface due to the abrasive nature of the anodized surface.

In addition to particulates created during vacuum chucking of a wafer, additional particulates are created during operations such as positioning the wafer between the front and back shoe so the wafer can be safely carried from a pre-processing storage area to a semiconductor processing chamber. First the wafer sits atop the front shoe of the blade, held in place by vacuum, then the vacuum is released and the blade slides forward and then backward beneath the wafer. The center of the wafer slides over the surface of the blade (toward the back of the blade) on the forward motion of the blade, and then the wafer drops into position between the front and rear shoe of the robot blade on the backward motion of the blade. The rear shoe is formed so that its leading edge is tapered at an angle. This permits the wafer to slide into a holding pocket between the front shoe and the rear shoe of the substrate handling blade, even when expansion differences between the handling blade and the semiconductor substrate would otherwise cause a misfit between a wafer and the holding pocket at particular process temperatures. The wafer typically sits at an angle of about 1° between the front shoe and the rear shoe.

The sliding action of the wafer over the front and rear shoe surfaces causes rubbing between the wafer and the trailing edge of the aluminum front shoe, and rubbing over the surface of the anodized aluminum rear shoe. The particulates produced accumulate on the bottom of the semiconductor substrate and can fall from the bottom surface of one wafer to the top surface of another wafer while the wafers are stacked in storage cassettes; the particulates can fall upon processing chamber surfaces or migrate to the substrate surface when the substrate is exposed to particularly high temperatures (in the range of 650° C.) during processing. The particulates travel by gravity, entrained in gas flow, and as a result of thermophoretic forces.

To further complicate matters, the wafer handling blade needs to be particularly thin, to negotiate its way between the narrowly spaced shelves in the storage cassette. The storage cassettes and the processing chambers are at elevated temperatures (frequently above 500° C.), and the handling blade must be thin. This combination of requirements has resulted in the selection of metals having a high stiffness, with thermal stability at elevated temperatures as the material of construction for the wafer handling blade.

In addition to the optical sensing methods described above for locating a semiconductor substrate within a processing system, a cassette, or on a handling blade surface, an additional sensing capability for the presence of a substrate upon the handling blade surface was developed. The additional sensing capability used capacitance and a voltage measurement to sense the presence of a semiconductor substrate on a handling blade. A capacitive sensing circuit was either bonded to the upper surface of the robot blade, or portions of the sensing circuit were located within the blade, with an opening on the upper surface of the blade, through which the sensor was exposed.

Although the use of a capacitive circuit to sense the presence of the semiconductor substrate on the handling blade surface is beneficial, improved thermal stability is desired. The capacitance sensor bonded to the upper surface of a handling blade frequently becomes delaminated from the underlying blade over time, due to failure of the bonding adhesive and/or thermal expansion differences between the sensing device and the blade itself over the typical 400° C.–650° C. operational temperature range. Since the metal blade generally serves as a ground for the capacitance circuit; when the capacitance sensor becomes delaminated, this results in a failure in the capacitance circuit. When the capacitance circuit does not sense a wafer on the handling blade surface at the proper time, the system will not function as designed and generally must be shut down.

In addition, whether the capacitance sensing device was adhered to the handling blade surface or was exposed through an opening in the handling blade surface, the sensor was subjected to the process environment of the wafer it handled. As a result, the sensor often becomes corroded with time, producing contaminants within the wafer processing equipment; and, parts of the sensor are frequently degraded, outgassing materials into the wafer processing environment.

All of the above factors reduced the reliability of the sensor and caused contamination within the semiconductor processing environment.

There is clearly a need for an improved semiconductor substrate handling blade which reduces particulate contamination due to the wearing of both the wafer and the blade surface. In addition, it is highly desirable to have a more reliable capacitance-based sensor means, which does not contaminate the process environment, which does not delaminate from the handling blade, and which provides a more reliable, consistent signal range at higher temperatures.

SUMMARY OF THE INVENTION

It has been discovered that the amount of particulate contamination produced due to rubbing between a semiconductor device substrate and a robotic substrate handling blade can be greatly reduced by the use of a specialized material either as the principal material of construction for the substrate handling blade, or as a coating upon the surface of the substrate handling blade. Preferably the specialized material is non-metallic, and most preferably it is a dielectric. In particular, the specialized material must exhibit the desired thermal stability (including stiffness and creep resistance) at temperatures in excess of the operational temperature experienced by the handling blade. The specialized material must also have a low-friction, non-abrasive surface which does not produce particulates when rubbed against the semiconductor device substrate; that is, the blade surface is not abraded by the semiconductor device substrate and the semiconductor device substrate is not abraded by the blade. Further, the specialized material should exhibit a low cohesive energy for the material comprising the surface of the semiconductor substrate; this prevents the surface of the handling blade from becoming "bonded" to the surface of the substrate in a manner which can cause particulates to leave either surface when separation of the substrate from the handling blade surface occurs.

The formation of particulates can be greatly reduced by the presence of a low-friction, smooth finish on the upper surface of the substrate handling blade. By a smooth finish, it is meant that the finish is an "optical" finish or a "mirror" finish and that there are no sharp or angular protrusions from the surface of the substrate handling blade.

In addition, it is also important that the surface be essentially pore-free (void free). By void-free, it is meant that the upper surface of the handling blade is free from bubbles, cracks or cavities which enable particulate formation upon abrasion and trap particles for subsequent release at an inopportune time.

A single crystal structure, a fine-grained polycrystalline structure, or a fused crystalline structure can be used to provide a smooth surface which is essentially void-free free. The essentially void-free structure typically contains less than about two percent by volume void space, preferably contains less than about one percent by volume void space, and more preferably contains less than about 0.5 percent by volume void space.

A preferred single crystal structure is, for example, single crystal sapphire, single crystal silicon, or single crystal silicon carbide. A preferred fine-grained polycrystalline structure is, for example, a polycrystalline ceramic. Boron nitride provides a particularly low-friction surface. A preferred fused crystalline structure is, for example, fused quartz.

Typically, a substrate handling blade comprises front and rear shoes which assist in the handling of wafers. It is particularly important that these front and rear shoes be constructed from a smooth, void-free, wear-resistant material of the kind described above and that edges of (and vacuum openings through) these shoes which may come in contact with the substrate be radiused (rounded). Construction of the front and rear shoes from the smooth, void-free, wear-resistant material has provided an unexpected reduction in the amount of particulates generated by the rubbing, wearing action between a semiconductor device substrate and the robotic substrate handling blade.

The substrate handling blade of the present invention can be constructed so that all exterior surfaces are comprised of a dielectric (electrically-insulating) material. The substrate handling blade can also be constructed with the major top (upper) surface being a dielectric, smooth, non-porous, wear-resistant layer and the major bottom (lower) surface being a metal or a conductive ceramic such as silicon carbide. The substrate handling blade can also be constructed with the front and rear shoes being formed of the dielectric material, with other blade materials being formed from conductive or semiconductor materials.

In one preferred embodiment substrate handling blade, the major top surface and the major bottom surface of the handling blade are constructed from the same smooth, non-porous, wear-resistant material, with the lower surface of the handling blade being supported by a ceramic holding structure.

In another preferred embodiment of the semiconductor substrate handling blade, a capacitance sensor is used to indicate the presence of the semiconductor substrate on the surface of the handling blade. The capacitance sensor is comprised of at least one electrically isolated capacitive sensor and a grounding source. Each capacitive sensor is comprised of a sensing layer and an underlying guard layer, separated by an electrically isolating layer. The guard layer is larger in dimension than the sensing layer and is located beneath the sensing layer. A voltage is applied to the guard layer which matched the voltage to the sensing layer, so that there will be no interference from conductive layers which are present beneath the guard layer.

When there is no semiconductor device substrate on the top surface of the substrate handling blade, very little capacitance is measured by the capacitance sensor. When there is a semiconductor device substrate on the top surface of the handling blade, the semiconductor device substrate forms one capacitor with the sensing layer and a second capacitor with the grounding layer. The amount of capacitance depends on the area of the semiconductor device substrate overlaying the sensing layer and/or the grounding layer and the distance between the semiconductor device substrate and the sensing layer and/or the grounding layer. Although it is possible to have the sensing layer form part of the top surface of the substrate handling blade, it is preferred to have the upper surface of the sensing layer located beneath an insulating layer which acts as the top (upper) surface of the handling blade.

In general, the capacitance measured for each capacitive sensor is the sum of the capacitance between the semiconductor substrate (when present) and the sensing layer and the capacitance between the semiconductor substrate and the grounding layer. Thus, the capacitance of the capacitance sensor is variable, and the total capacitance depends on whether the semiconductor substrate is present on the handling blade and the location of the semiconductor substrate on the handling blade.

When the major bottom surface of the substrate handling blade (the surface which does not contact the semiconductor substrate) is constructed from a conductive material, this bottom surface can be used as the grounding layer for the capacitance sensor, and it is not necessary to provide a separate grounding layer. When the substrate handling blade is constructed from an insulator, it is necessary to supply a grounding layer for the capacitance sensor, and this grounding layer is typically a conductive layer adjacent to, but isolated from the capacitive sensing layer.

BRIEF DESCRIPTION OF THE DRAWINGS

FIG. 1 illustrates a top planar view of one preferred embodiment of a substrate handling blade 100 of the present invention, including: 1) The bottom plate 202 of the handling blade 100, which comprises the vacuum supply 102 for vacuum chucking a semiconductor substrate (not shown); and, guard layers 105a and 105b, guard layer conductive lines 107a and 107b, guard layer connector leads 109a and 109b, and guard layer connectors 129a and 129b. 2) The top plate 101 of the handling blade 100, which comprises capacitive sensors 104a and 104b, capacitive sensor conductive lines 106a and 106b, capacitive sensor connector leads 108a and 108b, and capacitive sensor connectors 128a and 128b; and, grounding layer 110. Overlaying top plate 101 is a front "shoe" 116 which assists in lifting and positioning the substrate on the handling blade 100, and a rear shoe 120 which assists in holding the substrate on the robot handling blade 100 for certain operations.

FIG. 2 is a schematic of an exploded cross-sectional view of the substrate handling blade 100 which illustrates the major structural components shown in FIG. 1.

DETAILED DESCRIPTION OF THE PREFERRED EMBODIMENTS

The present disclosure pertains to a substrate handling apparatus which is used for handling semiconductor device substrates during processing. The semiconductor substrates are typically thin wafers comprised of materials such as silicon or gallium arsenide, but may also comprise thin glass plates having semiconductor devices deposited thereon.

Figure 1P:
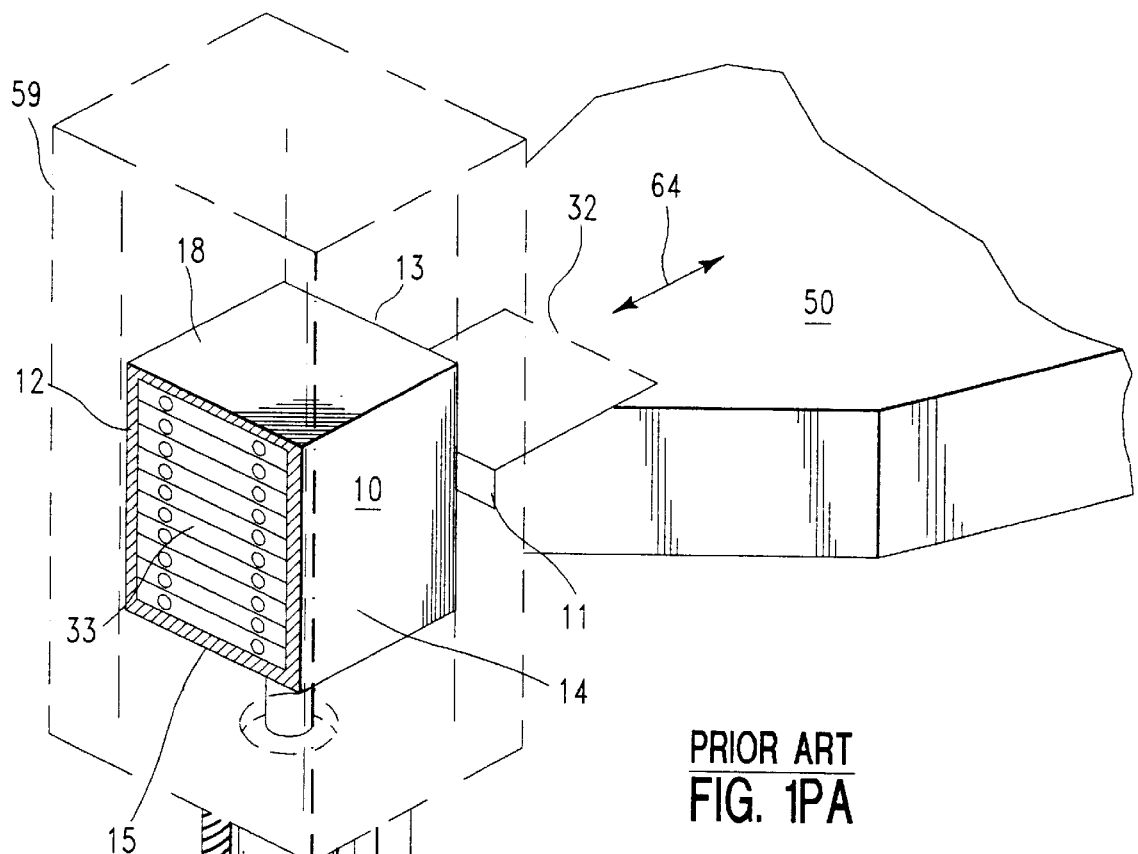
FIG. 1PA illustrates a three dimensional view of a known batch heating cassette 10 used for large semiconductor substrates 32 of the kind used in the fabrication of liquid crystal displays.
Figure 2P:
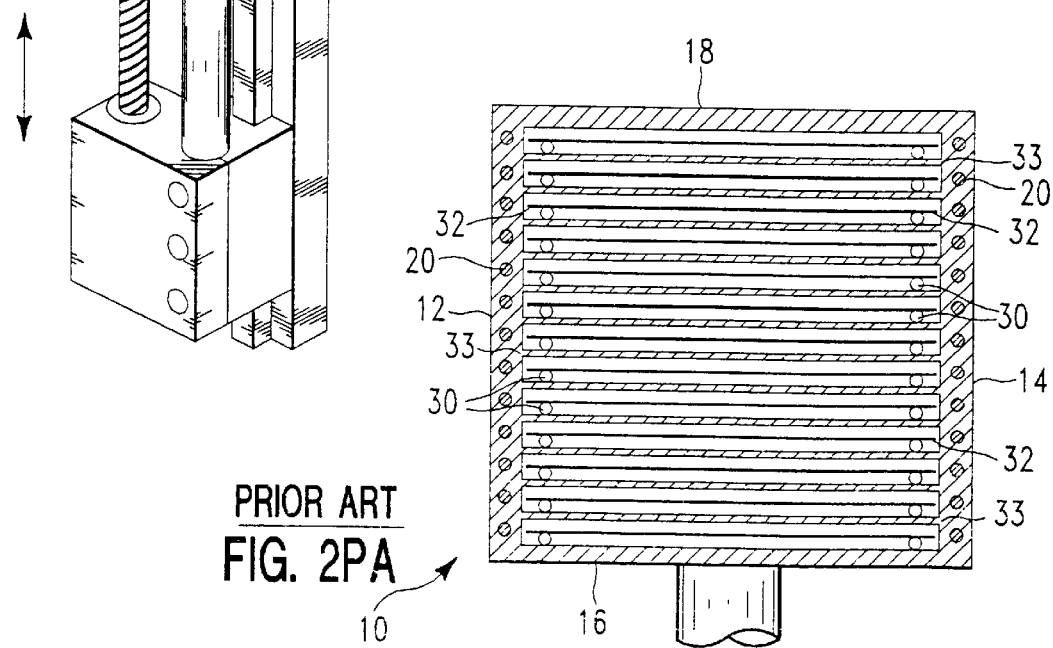
FIG. 2PA shows a cross-sectional view of the cassette 10 illustrated in FIG. 1PA, with the substrates 32 in place upon heating shelves 33 within the cassette 10.

Generally, the substrate handling apparatus obtains the substrate from one location and transfers it to another within the processing system. FIG. 1PA illustrates a three dimensional view of a known batch heating cassette 10 used for large substrates 32 of the kind used in the fabrication of liquid crystal displays. FIG. 2PA shows a cross-sectional view of the cassette 10 illustrated in FIG. 1PA, with the substrates 32 in place upon heating shelves 33 within the cassette 10. These Figures illustrate the close spacing between the stored semiconductor substrates 32 within the cassette 10. With reference to FIGS. 1PA and 2PA, a typical heating cassette 10 comprises sidewalls 12 and 14, and a bottom wall 16. A lid 18 is fastened to the top of the sidewalls 12 and 14. Additional side walls 13 and 15 close opposing ends of sidewalls 12 and 14. Sidewall 13, adjacent system chamber 50 is fitted with a slit valve 11 through which the substrate 32 can be transferred into and out of the cassette 10, in the direction indicated by the arrow 64.

The substrates 32 are positioned within the cassette 10 upon supports 30 (that are made of a non-conductive material such as high temperature glass or quartz) which are attached to or positioned upon radiant heater shelves 33.

Figure 3P:
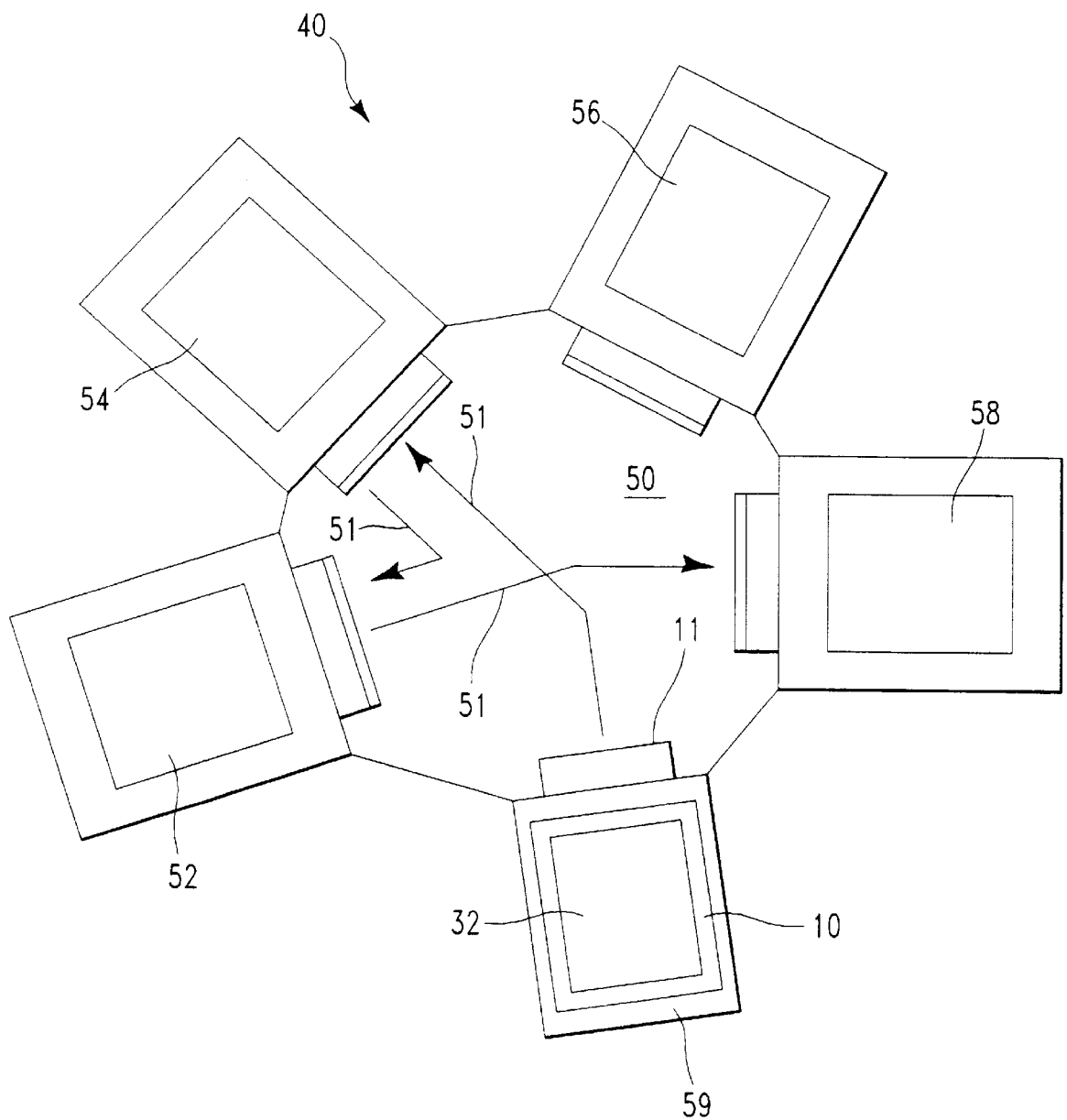
FIG. 3PA shows a system 40 of the kind in which cassette 10 is typically used. A central robotic vacuum chamber 50 contains a robot (not shown) that can transfer the substrates 32 from a heating chamber 59 containing cassette 10 to other processing chambers within the system 40.

For purposes of illustrating the use of cassette 10 in the storage of substrates, FIG. 3PA shows a system 40 of the kind in which cassette 10 is typically used. A central robotic vacuum chamber 50 contains a robot (not shown) that can transfer the substrates 32 from a heating chamber 59 containing cassette 10 through a suitable opening of slit valve 11 in the sidewall 13 adjacent to the chamber 50. When the substrates 32 have reached a CVD (chemical vapor deposition) processing temperature, the robot transfers a single substrate 21 from cassette 10 in chamber 59 to one of the processing chambers 52, 54, 56, or 58 to another in any predetermined sequence as shown by the arrows 51. After processing is complete, the robot transfers the substrate 32 to a cooling cassette (not shown) for cooling down to ambient temperatures.

As described in the background art, a robot arm is used to transfer substrates 32 within a system 40. The present disclosure pertains to a semiconductor support structure which makes up a portion of the robot used to transfer the substrates. This disclosure does dot describe the mechanical means for moving the semiconductor support structure because that is not the subject of the present invention, but such mechanical means are well known and described in the art.

FIG. 1 illustrates one preferred embodiment of a semiconductor device substrate handling apparatus of the present invention. Due to the kinds of enclosures and surfaces from which a semiconductor substrate must be loaded and unloaded, the support structure is typically thin, broad, and flat in dimension, and is generally referred to as a "handling blade". Future references herein are to a handling blade, but it is understood that the shape of the apparatus may be varied for specialized applications.

With reference to FIGS. 1 and 2, substrate handling blade 100 comprises an upper, top plate 101 and a lower, bottom plate 202 which typically are supported on a support structure 204 which is attached to a robot arm (not shown). Preferably, substrate handling blade 100 uses vacuum to hold a semiconductor substrate (not shown) to its upper surface (the upper surface 205 of upper plate 101, as shown in FIG. 2). In the embodiment shown in FIG. 1, a channel 102 is machined into the upper surface 203 of bottom plate 202 for purposes of conveying a vacuum from vacuum opening 103 (on upper surface 203 of bottom plate 202) to the leading edge of the upper surface 205 of top plate 101, where vacuum is applied at openings 118.

When a semiconductor substrate (not shown), is initially up loaded from a supporting surface, the leading edge 119 of handling blade 100 is slipped beneath the semiconductor substrate. To ease the leading edge 119 of handling blade 100 beneath the wafer substrate, a front shoe 116 having a tapered edge 114 is located on the leading edge 119 of blade 100. First the wafer sits atop the front shoe 116 of handling blade 100, held in place by vacuum applied through openings 118 on the upper surface of front shoe 116. To move the wafer to its final resting place on handling blade 100, the vacuum is released and handling blade 100 is moved forward and then quickly backward beneath the wafer. The center of the wafer slides over the upper surface 205 of the blade (toward the back of the blade) on the forward motion of handling blade 100, and then the wafer drops into position between the front shoe 116 and rear shoe 120 of handling blade 100 on the backward motion. The rear shoe 120 is formed so that its leading edge 122 is tapered at an angle. This permits the wafer to slide into a holding pocket between the front shoe 116 and the rear shoe 120 even when expansion differences between the handling blade 100 and the semiconductor substrate would otherwise cause a misfit between the substrate and the holding pocket at particular process temperatures. The substrate, wafer typically sits at an angle of about 2° or less from the front shoe 116 toward the rear shoe 120, but may lie flat as well.

The upper surface 205 of upper plate 101 of substrate handling blade 100 should provide a smooth, low-friction environment to prevent the generation of particulate contamination from the rubbing of the semiconductor substrate (not shown) upon upper surface 205 of handling blade 100. (A low cohesive energy for the semiconductor substrate surface provides an additional advantage.) The preferred surface finish is less than 1.0 micro inch (height of surface roughness) with a surface finish less than 0.2 micro inch being more preferred, and a surface finish of less than 0.1 micro inch being most preferred.

In addition, to prevent the generation of particulates, it is critical that the surface be as void-free as is reasonably possible. By void-free, it is meant that the surface layer is free from bubbles, cracks or cavities which enable particulate formation upon rubbing of the handling blade surface. Typically a void-free surface exhibits less than about two percent by volume void space, preferably less than about one percent by volume void space, and more preferably less than about 0.5 percent void space.

A single crystal structure, a fine-grained polycrystalline structure, or a fused crystalline structure can be used to provides a smooth, low-friction surface which is essentially void-free.

A single crystal structure is especially preferred. Examples of single crystal structures include, for example, single crystal sapphire, single crystal silicon, or single crystal silicon carbide. A single crystal differs significantly from typical ceramics, which are generally sintered together; and, once the fused surface is worn, there are many openings or voids exposed. Further, polishing of sintered materials to produce a smooth finish can create cracks and fissures under the polished surface. The openings, cracks and fissures all make available breaks in the surface of the handling blade which can lead to the generation of particulates upon rubbing.

A sufficiently fine-grained polycrystalline structure may also be used, for example, a fine-grained polycrystalline ceramic. Typically these fine-grained polycrystalline ceramics have a purity of about 99 percent or greater and a void volume less than about one percent. When a fine-grained polycrystalline structure is used, a smooth surface can be produced by polishing, chemically-etching, or sputter-etching the polycrystalline structure to provide a surface parallel to the crystalline lattice. A smooth, low-friction surface can also be obtained by applying a coating using chemical vapor deposition (CVD) and physical vapor deposition (PVD) techniques.

Or, a fused crystalline structure such as fused quartz has been shown to provide a smooth, essentially void-free, wear-resistant surface. At lower temperatures, polymeric materials such as those comprising high-temperature polyimides can be used to provide a smooth, void-free surface.

FIGS. 1–6 illustrate one preferred embodiment of substrate handling blade 100. The substrate handling blade 100 is formed from a top plate 101 and a bottom plate 202. The major upper surface 205 of top plate 101 and the major lower surface 206 of bottom plate 202 are constructed from the same smooth, non-porous, wear-resistant material, with the lower surface 206 of the handling blade being 100 being supported by a ceramic holding structure 204. The holding structure 204 does not contact the semiconductor substrate (not shown) and thus, may be constructed from materials which are easier to fabricate than the low porosity materials described above.

The holding structure 204 may both hold the handling blade 100 and contain electrical contacts and connections (not shown) for use in combination with a capacitance circuit used to sense the presence of a semiconductor substrate on the substrate handling blade 100. Materials of construction for the holding structure are preferably a ceramic because of cost considerations, but may be the same material as that from which a handling blade 100 is constructed, for purposes of simplicity. For example, and not by way of limitation, the thermal coefficient of expansion of single crystal sapphire is close to that of alumina-based ceramics (approximately $7.0$–$8.0 \times 10^{-6}$/°C.), and no delamination problem has been observed using a sintered alumina holding structure 204, in combination with a single crystal sapphire handling blade 100.

Substrate handling blade 100 can be constructed so that all exterior surfaces are comprised of a dielectric material, as illustrated in the preferred embodiment shown in FIGS. 1–6. The substrate handling blade 100 can also be constructed with the major top (upper) surface 205 being a smooth, non-porous, wear-resistant, dielectric layer and the major bottom (lower) surface 206 being a metal or a conductive ceramic such as silicon carbide. However the metal or conductive ceramic must have a thermal expansion coefficient very close to that of the non-conductive, wear-resistant material (preferably within about $1 \times 10^{-5}$/°C. or less; more preferably within about $1 \times 10^{-6}$/°C. or less; and, most preferably within about $5 \times 10^{-7}$/°C. or less), to avoid delamination of the non-conductive layer from the conductive layer over the handling blade 100 operating temperature. Further, the glass transition temperature of layers of differing materials should be sufficiently close that the migration of undesirable ions from one layer to another is avoided.

Construction of the front shoe 116 and rear shoe 120 of the substrate handling blade 100 from a smooth, void-free, wear resistant material such as, for example, single crystal sapphire has provided an unexpected reduction in the amount of particulates generated by the rubbing, wearing action between a semiconductor device substrate and the robotic substrate handling blade. A preferred method for bonding such a front shoe 116 and rear shoe 120 to the substrate handling blade 100 is by fusing the shoes to the upper surface 205 of the handling blade 100. Fusion can be obtained using co-firing at an elevated temperature, or by adhering the front and rear shoes with a bonding agent such as a sealing glass (glass frit) which melts to join the shoes to upper surface 205 at sufficient temperature. Preferably the sealing glass is a thermosetting devitrified sealing glass which has increased thermal stability over a thermoplastic vitreous sealing glass. Further, it is important to use a sealing glass which does not contain glassy-phase ions which can migrate into the front shoe 116, the rear shoe 120, or the upper surface 205 of handling blade 100 which contact the semiconductor substrate.

Figure 5:
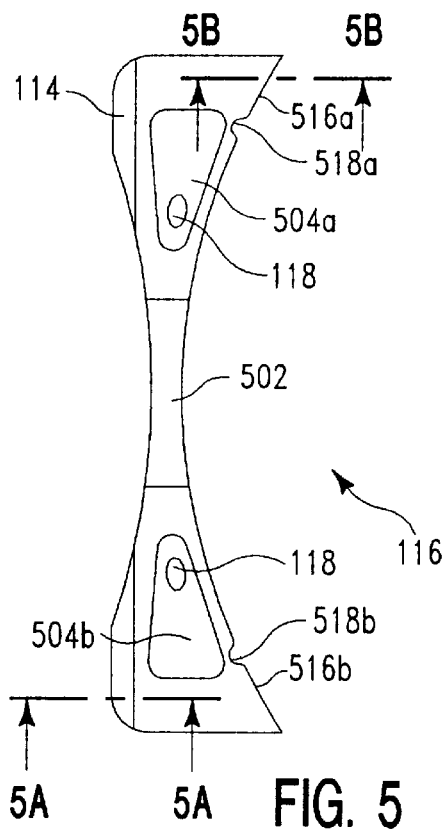
FIG. 5 shows a top planar view of a first embodiment of a front shoe 116 of substrate handling blade 100 (not shown), including: The tapered leading edge 114; substrate surface support pads 502 and 504; and vacuum openings 118.
Figure 5A:
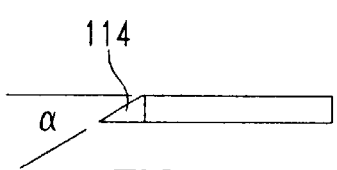
FIGS. 5A and 5B show details of FIG. 5.
Figure 6A:
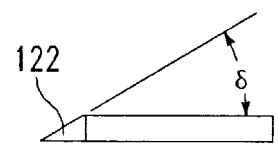
FIG. 6A shows a detail of FIG. 6.

FIG. 5 and details 5A and 5B illustrate one preferred embodiment of the front shoe used to assist in uploading a substrate from a storage cassette. As shown in FIG. 5 and FIG. 5A, front shoe 116 includes leading edge 114 which is tapered at an angle (typically in the range of about 10° to about 30°, and preferably about 15°). In the case of the 200 mm (approximately 7.8 in. diameter) wafer handling blade, the overall thickness of front shoe 116 is about 0.050 in. (1.3 mm), with the length of tapered section 114 being about 0.10 in. (2.5 mm). With reference to FIG. 5, the trailing edge 512 of front shoe 116, includes contact edges 516a and 516b which are designed to make two point contact with the edge of a semiconductor wafer resting in the pocket between front shoe 116 and rear shoe 120. When a Japanese wafer, having a square front portion is to be used, the front shoe 116 may have sections 518a and 518b (adjacent the square wafer corners) cut away to provide for the sharp edges at the front of the wafer (not shown). This, in combination with contact edges 516a and 516b of front shoe 116 are designed to ensure minimum contact and minimum potential for abrasion between the front shoe 116 and the wafer. The upper surface 506 of front shoe 116 includes vacuum openings 118 and sealing pads 504 (a) and 504 (b) located at least surrounding vacuum openings 118, as shown at 504 (a) and 504 (b). Sealing pads 504 (a) and 504 (b) are needed to stabilize the semiconductor substrate adjacent the vacuum opening 118, to permit sealing around the opening 118. Frequently a wafer to be uploaded is very hot and may be soft. It is not possible to get good vacuum chucking of the wafer against the upper surface 506 of front shoe 116 unless the surface 502 supports the soft wafer (not shown). Preferably upper surface 506 of front shoe 116 supports the wafer at three points, at sealing pads 504 (a) and 504 (b) and at a center pad 502 between these pads.

Figure 5B:
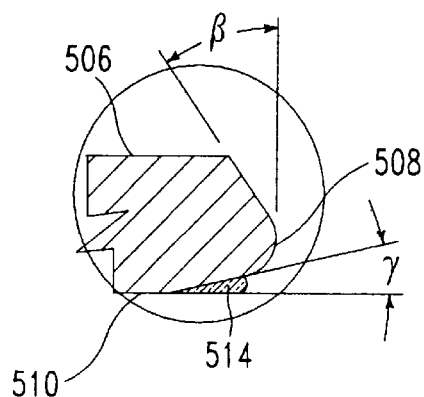

FIG. 5B shows other important features of front shoe 116. The radius of trailing edge 512 of front shoe 116, which contacts the wafer (not shown) when the wafer is positioned between front shoe 116 and rear shoe 120, preferably has a rounded surface 508 to avoid damaging the edge of the wafer when it is loaded and unloaded from substrate handling blade 100. Typically the trailing edge 512 is cut away beneath rounded surface 508 to form an angle γ (typically about 10°) against surface 510 (on the upper surface 205) of wafer handling blade 100. The space included within angle γ and interior to outer edge 508 provides for excess sealing glass 514 which flows during bonding of front shoe 116 to the upper surface 205 of top plate 101 of handling blade 100. It is important that excess sealing glass 514 not protrude forward of edge 508.

Further, to provide ease in off loading of the wafer from wafer handling blade 100, upper surface 506 of front shoe 116 is cut to form an angle β (typically ranging from about 15 to about 45°, and preferably ranging between about 20° and about 30°) with respect to the surface 205 of wafer handling blade 100, as shown in FIG. 5B. The rounded corners and cut away areas described above at the trailing edge 512 of front shoe 116 all help ensure that when the wafer slides over trailing edge 512 or is lifted out of the pocket between front shoe 116 and rear shoe 120, the wafer does not abrade the substrate handling blade 100.

Figure 6:
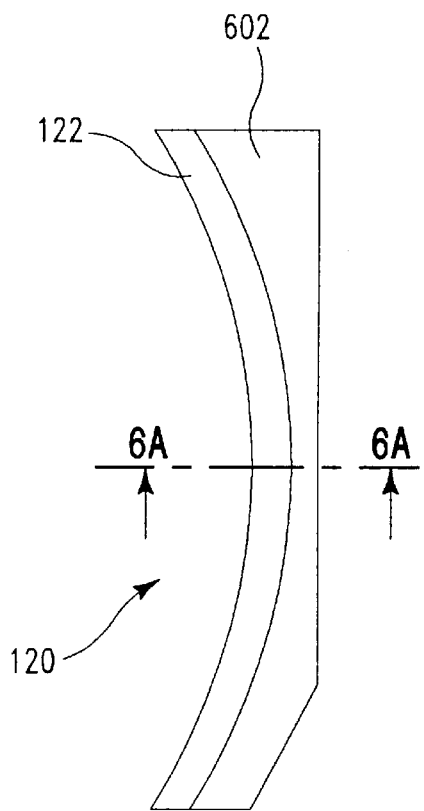
FIG. 6 shows a top planar view of a rear shoe 120 of substrate handling blade 100 (not shown), including the tapered leading edge 122.

FIG. 6 illustrates rear shoe 120, the leading edge 122 of which is tapered at an angle δ of about 15° to about 45° (preferably at an angle δ of about 20° to about 30°) from the upper surface 602 of rear shoe 120. This taper permits the wafer to slide up or down over leading edge 122, as described previously, to compensate for potential misfit of the wafer (not shown) between front shoe 116 and rear shoe 122. Preferably the radius of the leading edge 122 of rear shoe 120 is greater than the radius of the semiconductor substrate, wafer (not shown) to be handled by substrate handling blade 100. This ensures a single point of contact between the wafer edge and the leading edge 122 of rear shoe 120. Between the contact edges 516a and 516b of front shoe 116 and the radius of the leading edge 122 of rear shoe 120, contact with the wafer is controlled to three points at the locations specified, ensuring minimum wearing between the wafer and the front show 116 and rear shoe 120.

Front shoe 116 and rear shoe 120 are typically bonded to the upper surface 205 of substrate handling blade 100 using a sealing glass (glass frit) which is cured at about 800° C. under a mild pressure of about 7 to about 70 psi (about 1–10 MPa) in a holding frame.

Figure 7:
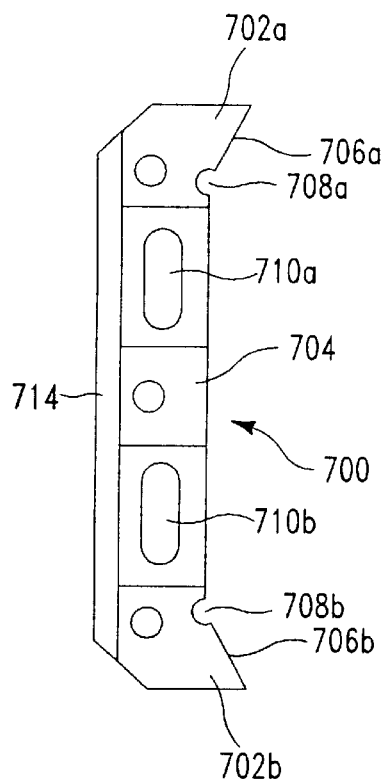
FIG. 7 illustrates a top planar view of a second embodiment of a front shoe 700 of substrate handling blade 100 (not shown), including: The tapered leading edge 714; substrate surface support pads 702a, 702b, and 704; and vacuum openings 710a and 710b.
Figure 8:
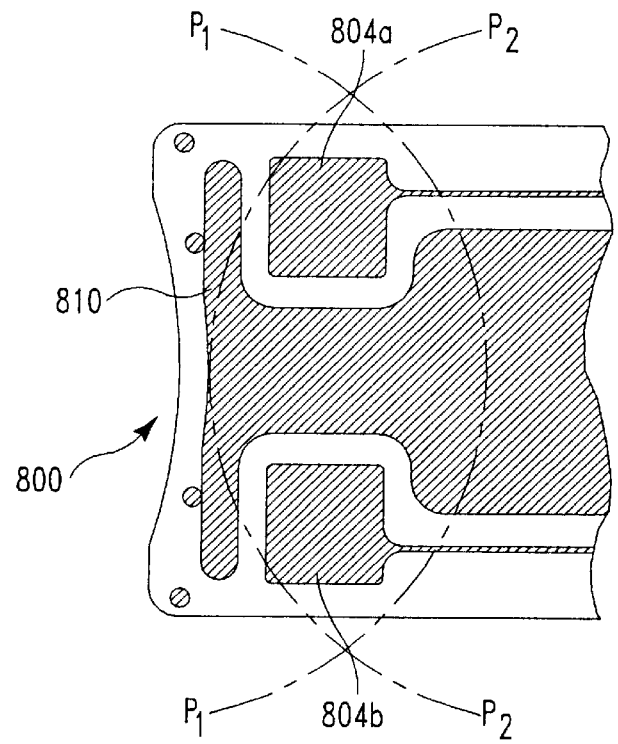
FIG. 8 illustrates a partial top view looking down on the lower surface 207 of top plate 101 of the handling blade 100, showing capacitive sensing layers 104a and 104b, and grounding layer 110. Overlaid on this view are two lines, $P_1$ and $P_2$. $P_1$ represents the leading edge of a semiconductor device substrate (not shown) placed on the top surface 205 of top plate 101 when the semiconductor substrate has been lifted from a pedestal or storage cassette onto the substrate handling blade top surface. $P_2$ represents the trailing edge of a semiconductor substrate (not shown) which is lying in the pocket created between front shoe 116 and back shoe 120 on the top surface 207 of the top plate 101 of handling blade 100.

FIG. 7 illustrates a second embodiment of a front shoe 700. Tapered leading edge 714 permits a semiconductor wafer (not shown) to slide up or down over leading edge 714, as described previously. Wafer support pads 702a, 702b, and 704 support a wafer so that it can be more easily vacuum chucked using a vacuum supplied through vacuum openings 710a and 710b. Cut away sections 708a and 708b provide for the edges of a Japanese wafer, and curved sections 706a and 706b make the two point contact with the wafer.

Figure 9:
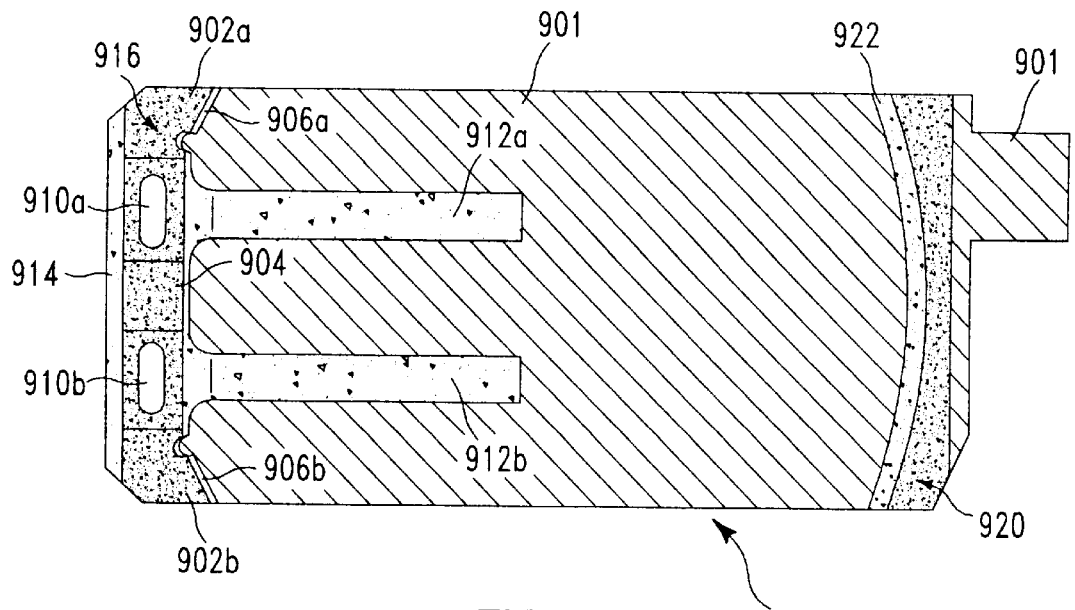
FIG. 9 shows a top planar view of an alternative embodiment of a semiconductor device substrate handling blade 900. This embodiment uses a front shoe 916 and back shoe 920 constructed from a smooth, void-free, wear-resistant, dielectric material, while the top surface 901 of substrate handling blade 900 is constructed from a conductive or semiconductive material.

FIG. 9 shows a top planar view of an alternative embodiment of a semiconductor device substrate handling blade 900. This embodiment uses a front shoe 916 and back shoe 920 constructed from a smooth, void-free, wear-resistant material, while the top surface 901 of substrate handling blade 900 is constructed from a more standard material, which may be a conductive, semiconductive, or dielectric material. Vacuum openings 910a and 910b permit vacuum chucking of a semiconductor wafer upon the upper surface of front shoe 916 of substrate handling blade 900. Substrate support pads 902a, 902b, and 904 support the wafer to assist in such vacuum chucking. Front shoe 916 and rear shoe 920 can be constructed of a dielectric material and exhibit a topology which prevents contact of a semiconductor device substrate with conductive or semiconductive top surface 901.

Figure 3:
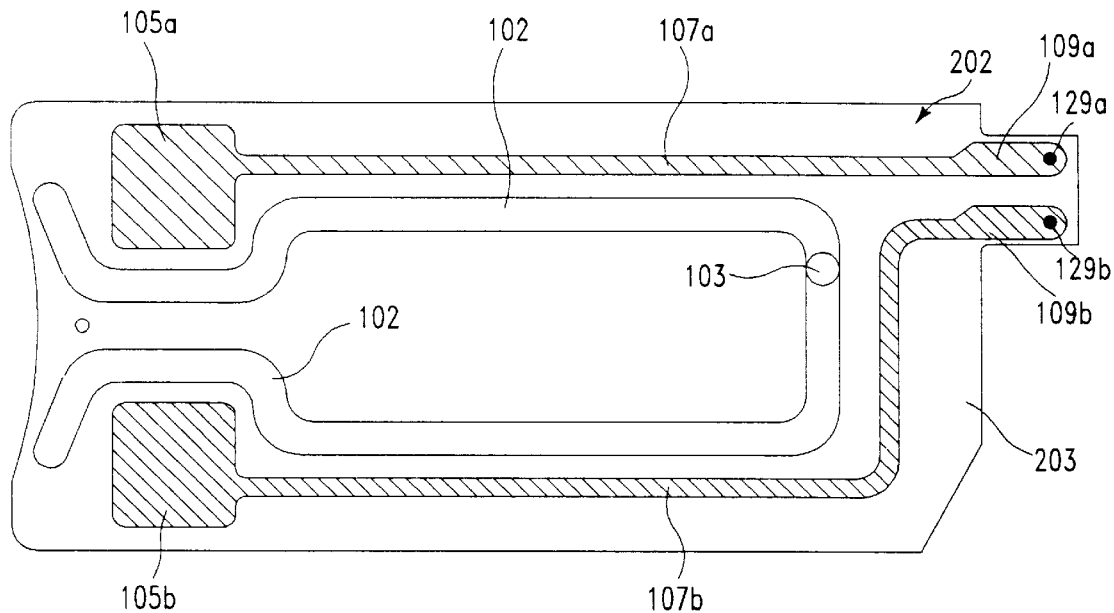
FIG. 3 shows a top planar view of the upper surface 203 of the bottom plate 202 of the substrate handling blade 100, including: The vacuum path 102 for supply of vacuum to the front shoe (not shown) of the substrate handling blade 100; and, guard layers 105a and 105b, guard layer conductive lines 107a and 107b, guard layer connector leads 109a and 109b, and guard layer connectors 129a and 129b.
Figure 4:
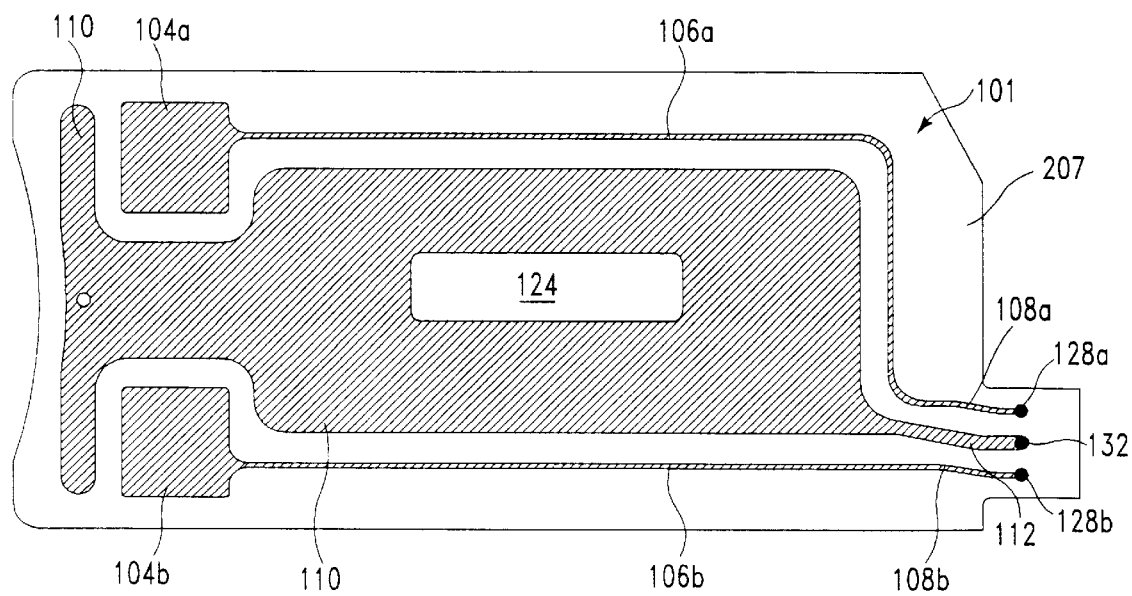
FIG. 4 shows a top planar view of the lower surface 207 of the top plate 101 of the substrate handling blade 100, including: The capacitive sensing layers 104a and 104b, capacitive sensing layer conductive lines 106a and 106b, capacitive sensing layer connector leads 108a and 108b, and capacitive sensing layer connectors 128a and 128b; and, grounding layer 110.

FIGS. 1, 3, 4, and 8 illustrate a particularly preferred embodiment of the semiconductor substrate handling blade 100, in which a capacitance sensor is used to indicate the presence of the semiconductor substrate (not shown) on the surface of the handling blade 100. Such a capacitance sensor is shown in FIG. 1. With reference to FIGS. 1, 3, and 4, the capacitance sensor is comprised of at least one electrically isolated capacitive sensor and at least one grounding layer. Preferably there are two capacitive sensors, to provide redundancy within the system. Each capacitive sensor is comprised of a sensing layer 104a and 104b, and a guard layer 105a and 105b, separated by an electrically isolating layer (not shown). The guard layer 105a and 105b is larger in dimension than the sensing layer 104a and 104b, respectively and is located beneath the sensing layer 104a and 104b. A voltage is applied to the guard layer which matched the voltage to the sensing layer, so that there will be no interference from conductive layers which underlie the guard layer.

When there is no semiconductor device substrate on the top surface of the substrate handling blade, very little capacitance is measured by the capacitance sensor. When there is a semiconductor device substrate on the top surface of the handling blade, the semiconductor device substrate forms one capacitor with the sensing layer and a second capacitor with the grounding layer. The amount of capacitance depends on the area of the semiconductor device substrate overlaying the sensing layer and/or the grounding layer and the distance between the semiconductor device substrate and the sensing layer and/or the grounding layer. For example, with reference to FIG. 8, which shows a partial top view looking down on capacitive sensing layers 104a and 104b, and grounding layer 110, line $P_1$ (Position 1) represents the leading edge of a semiconductor wafer (not shown) on the upper surface 205 of top plate 101 when the semiconductor substrate has been lifted from a pedestal or storage cassette onto the substrate handling blade top surface. Line $P_2$ (Position 2) represents the trailing edge of a semiconductor wafer (not shown) which is lying in the pocket created between front shoe 116 and back shoe 120 on the upper surface 205 of the top plate 101 of handling blade 100. When the semiconductor wafer is in Position 1, the capacitance detected by the capacitance sensor is less than when the semiconductor wafer is in Position 2. This is because there is a greater distance between the semiconductor wafer and the sensing layer and between the semiconductor wafer and the grounding layer when the wafer is in Position 1. In addition, there is an increased surface area of the semiconductor wafer overlying the sensing layer and the grounding layer when the wafer is in Position 2. Thus, three capacitance readings are possible: 1) Low capacitance when there is no wafer on the surface of the substrate handling blade; 2) Moderate capacitance when the wafer is in Position 1; and, 3) High capacitance when the wafer in Position 2.

Although it is possible to have the sensing layer form part of the top surface of the substrate handling blade, it is preferred to have the upper surface of the sensing layer located beneath an insulating layer which acts as the top (upper) surface of the handling blade. This prevents exposure of the sensing layer to the corrosive environment of the semiconductor substrate processing chamber.

Sensing layers 104a and 104b are connected via sensor conductive lines 106a and 106b and sensor connector leads 108a and 108b to sensor connectors 128a and 128b, as shown in FIGS. 1 and 4. Guard layers 105a and 105b are connected via guard conductive lines 107a and 107b and guard connector leads 109a and 109b to guard connectors 129a and 129b, as shown in FIGS. 1 and 3.

When the lower major surface 206 (the surface which does not contact the semiconductor substrate) of the substrate handling blade 100 is constructed from a conductive material, it can be used as the grounding layer for the capacitative sensor, and it is not necessary to provide a separate grounding layer. When the substrate handling blade 100 is constructed from an insulator, it is necessary to supply a grounding layer. This grounding layer is typically a conductive layer adjacent to, but isolated from the capacitative sensor; this ground is shown as 110 in FIGS. 1 and 4.

With reference to FIGS. 1 and 2, a substrate handling blade 100 comprising a top plate 101 and a bottom plate 102, and having front shoe 116 and rear shoe 120 located on the upper surface 205 of top plate 101 was constructed as follows. Top plate 101 and bottom plate 102, as well as front shoe 116 and rear shoe 120 were constructed from single crystal sapphire. Since single crystal sapphire is directional, it was necessary to line up the crystalline lattice of each layer of material with that of the crystalline lattice of another layer to which it was to be bonded or fused.

As shown in FIG. 3, the upper surface 203 of bottom plate 202, was machined to produce a vacuum channel 102 about 0.006 in. to about 0.009 in. deep. In addition, a pattern for guarding layers 105a and 105b with conductive lines 107a and 107b, and conductive leads 109a and 109b was also machined into the upper surface 203 of bottom plate 202 to a depth of about 0.003 in. to about 0.004 in. This machined pattern was of sufficient depth to enclose not only guarding layers 105a and 105b, but also sensing layers 104a and 104b. Further, a pattern for grounding layer 110 was machined into the upper surface 203 of bottom plate 202, although this is not shown, for purposes of making the layout of the capacitive sensor easier to understand.

A silver paste was applied over the machined surface patterned for guarding layers 105a and 105b, partially filling the machined pattern. The silver paste was dried. A layer of insulating sealing glass (not shown) was applied over the surface of each guard layer, including all conductive lines, such as 105a, 107a, and 109a, as well as 105b, 107b, and 109b. Additional sealing glass was deposited directly upon the upper surface 203 of bottom plate 202 as necessary for bonding bottom plate 202 to top plate 101 in a manner which would provide a seal between vacuum channel 102 and the environment exterior to handling blade 100 without filling or blocking vacuum channel 102.

The conductive pattern for sensing layers 104a and 104b, with conductive lines 106a and 106b, and conductive leads 108a and 108b and the conductive pattern for grounding layer 110 was silk screened and dried upon the bottom surface 207 of top plate 101.

As previously described, the guard layers 105 (a) and 105 (b) on the upper surface 203 of lower plate 202 are larger in dimensional area that the sensor layers 104 (a) and 104 (b) on the lower surface 107 of upper plate 101. For example, a typical wafer handling blade for a 7.8 in. diameter (200 mm) wafer would have a length of about 8.5 inches (216 mm), excluding connection elements, and a width of about 4 inches (102 mm), and a cross sectional thickness of about 0.065 in. to about 0.085 in. (about 1.65 mm to about 2.16 mm), excluding front and rear shoes. The guard layers 105 (a) and 105 (b) for this substrate handling blade would be approximately 1.1 in×1.1 in (27.9 mm by 27.9 mm) while the sensor layers 104 (a) and 104 (b) would be smaller in dimension by about 0.046 in. in each direction, or about 0.023 in. on each side (26.7 mm by 26.7 mm).

The bottom plate 202 and the top plate 101 of the substrate handling blade 100 were then mated so that the sensing layers 104a and 104b overlaid the guard layers 105a and 105b, respectively, with the layer of insulating sealing glass (not shown) separating the sensing layers 104a and 104b from the guard layers 105a and 105b. The sandwich of materials was then fused together under a nominal pressure (typically a few atmospheres) at a temperature sufficient to melt the sealing glass, for example, about 850° C.

In an alternative embodiment, rather than using sealing glass to provide an insulating layer between the sensing layers 104a and 104b and the guard layers 105a and 105b, respectively, a third layer of a dielectric such as single crystal sapphire, fine grained ceramic, sintered ceramic, or fused quartz can be used to provide the insulating layer. The three layers, top plate 101, insulating center layer, and bottom plate 202 can then be fused together by co-firing at an elevated temperature or by co-firing with a sealing glass used to bond the three layers together.

As an alternative to using a conductive paste, the patterned capacitance sensors and ground can be applied by laminating a patterned metal foil to the appropriate surface.

The cured, fired sealing glass (glass frit) must be stable to about 500–800° C. Typically it must withstand semiconductor processing conditions of about 700° C. or lower. Not only must the cured glass frit be dimensionally stable at these temperatures and maintain its stiffness so the substrate handling blade does not soften or sag, there can be no offgassing from the glass frit. With this in mind, the glass frit is preferably a devitrified glass frit comprising an aluminoborosilicate glass with low alkali content. Further, the sealing glass should have a linear thermal expansion coefficient and glass transition temperature closely matching that of the handling blade plates. Preferably, the difference in linear thermal expansion coefficient is less than about $1\times10^{-5}/°C.$, more preferably the difference is less than about $1\times10^{-6}/°C$., and most preferably the difference is less than about $5\times10^{-7}/°C$.

One of the great advantages of using an electrically non-conductive material for fabrication of plates 101 and 202 is that such materials are typically less thermally conductive as well. As a result, the electronic circuitry of the capacitance sensor is more protected from temperature extremes which the exterior surface of the handling blade may experience for short time periods. For example, the thermal conductivity of single crystal sapphire drops off rapidly at temperatures above about $-200°$ C. Thermal conductivity of single crystal sapphire at 25° C. is about 0.4 watts/cm/°K; at 200° C., it is about 0.26 watts/cm/°K; and, at 600° C., it is about 0.14 watts/cm/°K. This compares with aluminum which has a thermal conductivity of about 2.7 watts/cm/°K at 25° C.; about 2.4 watts/cm/°K at 200° C.; and, 2.1 watts/cm/°K at 600° C. Since aluminum has a thermal conductivity which is 7 to 10 times greater than that of single crystal sapphire over the temperature range referenced, the electrical circuitry which lies within a handling blade, just under an aluminum surface layer, is likely to see considerable higher temperatures when the surface of the handling blade is exposed to high temperatures for a short period of time. Examples of this would be when a handling blade enters a processing chamber for a short time period and that chamber is at an elevated temperature; and, when the surface of the handling blade is in contact with a hot semiconductor device substrate for a short period of time.

When the substrate handling blade comprises a conductive material, it is necessary to isolate the conductive capacitance patterns from the conductive handling blade material using an insulator between the handling blade material and the conductive capacitance pattern. For example, glass frit can be used to bond a patterned foil to the conductive handling blade material, where both the foil substrate and the glass frit act to create the necessary isolation of the two conductive materials.

The conductive patterns used to create the capacitive sensor for the semiconductor substrate are preferably formed from a silver paste. The silver may be an alloy. Examples of metallic materials useful for creating the conductive portions of the capacitance sensor include, not by way of limitation, silver, molybdenum, tungsten, copper, and alloys thereof. It is important that the diffusion coefficient for the conductive material through surrounding dielectric materials be very low or that a barrier layer be used to prevent diffusion of the conductive material through such dielectric materials. For example, the diffusion coefficient of silver through sapphire is very low. If this were not the case, the semiconductor industry would not want to use silver because it causes contamination problems.

The above described preferred embodiments are not intended to limit the scope of the present invention, as one skilled in the art can, in view of the present disclosure expand such embodiments to correspond with the subject matter of the invention claimed below.

We claim:

1. A method of fabricating an apparatus for handling a semiconductor substrate, comprising the steps of:
   a) providing a top plate having a top plate major upper surface at least a portion of which is formed from a specialized material having an essentially void-free structure and an optical or mirror finish, and having a top plate major lower surface;
   b) providing a bottom plate having a bottom plate major upper surface and a bottom plate major lower surface;
   c) machining either said top plate major lower surface or said bottom plate major upper surface to provide for a pattern including at least one capacitance sensor;
   d) filling at least a portion of said machined pattern with a first layer of conductive material;
   e) applying a patterned second layer of conductive material to either said top plate major lower surface or to said bottom plate major upper surface, which surface has no conductive pattern on it;
   f) applying an insulator over at least a portion of either said first layer of conductive material or said second layer of conductive material;
   g) attaching said top plate to said bottom plate to form a cohesive unit, in a manner such that said combined pattern of said first and second conductive layers forms a capacitance sensor.

2. The method of claim 1, including an additional step, comprising:
   machining a vacuum channel into either said top plate major lower surface or said bottom plate major upper surface.

3. The method of claim 1 or claim 2, wherein said apparatus is a handling blade.

4. The apparatus of claim 3, wherein said capacitive sensor is comprised of a sensing layer and an underlying guard layer, separated by an electrically isolating layer.

5. The apparatus of claim 1 or claim 2 or claim 3 or claim 4, wherein said apparatus is a handling blade.

6. The apparatus of claim 4 or claim 5, wherein said apparatus is a handling blade.

7. A semiconductor substrate handling blade used to lift or carry a semiconductor substrate from one process or storage location to another, wherein an upper surface of said handling blade, which contacts said semiconductor substrate, is formed from a specialized material having an essentially void-free structure, wherein said upper surface is a smooth, low-friction surface, whereby said surface reduces the generation of particulates when contacted with said semiconductor substrate; wherein said upper surface comprises a front shoe and a rear shoe formed from said specialized material, whereby a surface of said front and rear shoe which contacts said semiconductor substrate is wear-resistant; wherein the shape of said front shoe provides for two points of contact between a trailing edge of said front shoe and said semiconductor substrate; and, wherein said trailing edge of said front shoe comprises cut-away sections which permit fitting to a semiconductor device substrate which has corners, whereby damage to said corners is reduced or avoided.

8. The semiconductor substrate handling blade of claim 6 or claim 7, wherein said specialized material has an essentially void-free structure having a smooth, optical or mirror finish.

* * * * *

UNITED STATES PATENT AND TRADEMARK OFFICE
CERTIFICATE OF CORRECTION

PATENT NO. : 6,024,393
DATED : February 15, 2000
INVENTOR(S) : Behzad Shamlou, Wen Chiang Tu, Xuyen Pham, Yu Chang, Daniel Clark, Shun Wu It is certified that error appears in the above-identified patent and that said Letters Patent is hereby corrected as shown below:

Column 16,
Line 32, A new claim which was allowed but inadvertently not printed should be inserted as claim 4, as follows:
-- 4. An apparatus for handling a semiconductor substrate, comprising:
a surface upon which said semiconductor substrate is lifted or carried from one process or storage location to another, wherein said surface is formed from a specialized material having an essentially void free structure, wherein said surface is a smooth, low friction surface, whereby said surface reduces the generation of particulates when contacted with said semiconductor substrate; wherein an upper surface of said apparatus comprises a capacitance sensor which is used to detect the presence of said semiconductor substrate over said upper surface; and wherein said capacitive sensor is comprised of at least one electrically isolated capacitive sensor and at least one grounding source or layer. --
Line 32, Claim 4, as issued should be renumbered as Claim 5 0 and Claim 5 should be amended as follows: "The apparatus of claim 3" should be deleted and --The apparatus of claim 4-- should be inserted.
Line 35 Claim 5, should be deleted, as it is present as claim 6.
Line 39, A new claim which was allowed but inadvertently not printed should be inserted as claim 7 as follows: -- 7. A semiconductor substrate handling blade used to lift or carry a semiconductor substrate from one process or storage location to another, wherein an upper surface of said handling blade, which contacts said semiconductor substrate, is formed from a specialized material having an essentially void-free structure, wherein said upper surface is a smooth, low-friction surface, whereby said surface reduces the generation of particulates when contacted with said semiconductor substrate; wherein said upper surface comprises a front shoe and a rear shoe formed from said specialized material, whereby a surface of said front and rear shoe which contacts said semiconductor substrate is wear-resistant; and, wherein said front shoe comprises a vacuum chuck for chucking a semiconductor substrate placed on a surface of said front shoe. --

UNITED STATES PATENT AND TRADEMARK OFFICE
CERTIFICATE OF CORRECTION

PATENT NO. : 6,024,393
DATED : February 15, 2000
INVENTOR(S) : Behzad Shamlou, Wen Chiang Tu, Xuyen Pham, Yu Chang, Daniel Clark, Shun Wu It is certified that error appears in the above-identified patent and that said Letters Patent is hereby corrected as shown below:

Column 16, (con't)
Line 39 Claim 7, as issued should be renumbered Claim 8 0
Line 58 Claim 8, as issued should be renumbered Claim 9 and amended as follows:
"The semiconductor substrate handling blade of claim 6 or 7" should be deleted
and --The semiconductor handling blade of claim 7 or 8-should be inserted.

Signed and Sealed this

Ninth Day of October, 2001

Attest:

NICHOLAS P. GODICI
Attesting Officer
Acting Director of the United States Patent and Trademark Office